(12) United States Patent
Hyoung et al.

(10) Patent No.: US 12,514,023 B2
(45) Date of Patent: Dec. 30, 2025

(54) LIGHT-RECEIVING DEVICE HAVING ELECTROMAGNETIC INTERFERENCE REMOVAL FUNCTION

(71) Applicant: ELECTRONICS AND TELECOMMUNICATIONS RESEARCH INSTITUTE, Daejeon (KR)

(72) Inventors: Chang Hee Hyoung, Daejeon (KR); Jung Hwan Hwang, Daejeon (KR); Jong Hwa Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 404 days.

(21) Appl. No.: 18/137,583

(22) Filed: Apr. 21, 2023

(65) Prior Publication Data

US 2024/0014336 A1    Jan. 11, 2024

(30) Foreign Application Priority Data

Jul. 8, 2022  (KR) .......................... 10-2022-0084295

(51) Int. Cl.
*H10F 77/14*    (2025.01)
*H10F 77/30*    (2025.01)
*H10F 77/40*    (2025.01)

(52) U.S. Cl.
CPC ......... *H10F 77/147* (2025.01); *H10F 77/337* (2025.01); *H10F 77/413* (2025.01)

(58) Field of Classification Search
CPC .... H10F 77/147; H10F 77/337; H10F 77/413; H10F 77/14; H10F 77/241; H10F 77/30; H10F 30/223; H10F 30/225

See application file for complete search history.

(56) References Cited

U.S. PATENT DOCUMENTS

| | | | |
|---|---|---|---|
| 5,345,074 A * | 9/1994 | Tonai | H10F 30/2215 257/E31.059 |
| 6,832,073 B2 | 12/2004 | Jang et al. | |
| 8,823,121 B2 | 9/2014 | Suh et al. | |
| 2004/0223704 A1 * | 11/2004 | Fujii | G02B 6/424 385/88 |
| 2006/0060933 A1 * | 3/2006 | Gao | H10F 30/223 257/458 |
| 2018/0219120 A1 * | 8/2018 | Huang | H10F 30/2255 |

FOREIGN PATENT DOCUMENTS

| | | |
|---|---|---|
| CN | 101106208 A | 1/2008 |
| KR | 10-2002-0019413 A | 3/2002 |
| KR | 10-0369254 B1 | 3/2003 |

(Continued)

*Primary Examiner* — Sitaramarao S Yechuri
(74) *Attorney, Agent, or Firm* — LRK PATENT LAW FIRM

(57) ABSTRACT

A light-receiving device having an electromagnetic interference removal function is provided. The light-receiving device includes a waveguide-shaped structure that extends in a traveling direction of photons and high-frequency electromagnetic waves incident on a light-receiving area and that surrounds the light-receiving area, and an insulating layer configured to fix the waveguide-shaped structure.

14 Claims, 9 Drawing Sheets

(56) References Cited

FOREIGN PATENT DOCUMENTS

| KR | 10-1186999 | B1 | 10/2012 |
| KR | 10-1358587 | B1 | 2/2014 |
| KR | 10-1699250 | B1 | 1/2017 |
| KR | 10-2018-0075454 | A | 7/2018 |
| KR | 10-2020-0014792 | A | 2/2020 |

* cited by examiner

LIGHT-RECEIVING DEVICE HAVING ELECTROMAGNETIC INTERFERENCE REMOVAL FUNCTION

CROSS-REFERENCE TO RELATED APPLICATION

This application claims the benefit of Korean Patent Application No. 10-2022-0084295 filed on Jul. 8, 2022, in the Korean Intellectual Property Office, the entire disclosure of which is incorporated herein by reference for all purposes.

BACKGROUND

1. Field of the Invention

One or more embodiments relate to a light-receiving device having an electromagnetic interference removal function.

2. Description of Related Art

A light-receiving device is a device that transforms light energy into electric energy and is divided into a light detector (or a light sensor) and a solar cell. When light is incident on a p-n junction or a contact surface between a metal and a semiconductor among light-receiving devices, an electromotive force is generated, and a detector using the electromotive force is called a photovoltaic light-receiving device. A p-n junction photodiode in which a thin p-type layer is formed on an N-type silicon wafer by a diffusion method is a typical photovoltaic light-receiving device.

A pin photodiode is a device with higher response than the p-n junction diode. In the pin photodiode, higher response speed may be obtained by widening a depletion layer by inserting an intrinsic semiconductor between a p layer and an n layer. The pin photodiode is used for optical communication, an illuminance sensor, a color sensor, and a proximity sensor.

The above description has been possessed or acquired by the inventor(s) in the course of conceiving the present disclosure and is not necessarily an art publicly known before the present application is filed.

SUMMARY

A laser scanner is a device that uses a light-emitting element, a light-receiving device, and a reflective mirror to detect an object located within a certain range through a change in laser that is reflected and returned to an object to be scanned. The laser scanner is being used in a screen door obstacle detection system that detects a presence or absence of passengers and belongings between a screen door provided at a platform and a train door.

The light-receiving device is exposed to high-frequency electromagnetic waves as well as light directly emitted from a light-emitting element or light reflected from an object in an environment in which the light-receiving device is used. An existing light-receiving device may malfunction due to high-frequency electromagnetic waves. As a 5G service is commercialized, mobile communication electromagnetic waves have a directivity characteristic of radiating electromagnetic waves in a specific direction instead of an existing isotropic electromagnetic wave characteristic. Compared to isotropic electromagnetic waves, directional electromagnetic waves concentrate in a specific direction and thus have a higher power density per unit area. The light-receiving device may malfunction when exposed to high-frequency electromagnetic waves having such high power density. Accordingly, the system stability and reliability of a public transportation safety facility in which a screen door using the light-receiving device is installed may degrade.

Since a railroad or a subway platform is where many passengers who want to use trains gather and safety accidents due to carelessness or intention of passengers frequently occur, there is a need to reduce a possibility of malfunction of the light-receiving device in the laser scanner. Accordingly, a technology for improving the stability and reliability of the safety facility in which the light-receiving device is used by preventing malfunction of the light-receiving device exposed to high-frequency electromagnetic waves may be required.

Embodiments may provide a technology for preventing interference due to high-frequency electromagnetic waves and malfunction of the light-receiving device by providing a structure that removes or collects directional high-frequency electromagnetic waves having high power density from a light incident surface of the light-receiving device and a path connected to the ground by being connected to the structure.

However, the technical aspects are not limited to the aforementioned aspects, and other technical aspects may be present.

According to an aspect, there is provided a light-receiving device including a waveguide-shaped structure that extends in a traveling direction of photons and high-frequency electromagnetic waves incident on a light-receiving area and that surrounds the light-receiving area, and an insulating layer configured to fix the waveguide-shaped structure.

The waveguide-shaped structure may have one of a shape of a circular waveguide and a shape of a rectangular waveguide.

The shape of the rectangular waveguide may be formed in a lattice structure.

The insulating layer may include a first insulating layer formed on a p-type semiconductor of the light-receiving device and a second insulating layer formed on the first insulating layer, and the waveguide-shaped structure may extend along a slope of the second insulating layer on top of the second insulating layer and may be an anode electrode.

The insulating layer may include a first insulating layer formed on a p-type semiconductor of the light-receiving device and a second insulating layer formed above the first insulating layer, and the waveguide-shaped structure may be formed on the second insulating layer and protrude out on a light incident surface of the light-receiving device in the traveling direction.

The waveguide-shaped structure may be modified into a dipole antenna structure that is open on an opposite side of a side connected to an external connection terminal of the light-receiving device.

In a structure in which a cathode electrode, an n-type semiconductor, and an intrinsic layer are sequentially stacked, the p-type semiconductor may be formed in an upper portion of the intrinsic layer, and the first insulating layer and an antireflection film may be formed in an upper layer of the p-type semiconductor.

According to an aspect, there is provided a light receiver including a light-receiving device and a plurality of diodes, wherein the light-receiving device includes a waveguide-shaped structure that extends in a traveling direction of photons and high-frequency electromagnetic waves incident on a light-receiving area and that surrounds the light-receiving area, and an insulating layer configured to fix the waveguide-shaped structure.

The waveguide-shaped structure may have one of a shape of a circular waveguide and a shape of a rectangular waveguide.

The shape of the rectangular waveguide may be formed in a lattice structure.

The insulating layer may include a first insulating layer formed on a p-type semiconductor of the light-receiving device and a second insulating layer formed on the first insulating layer, and the waveguide-shaped structure may extend along a slope of the second insulating layer on top of the second insulating layer and may be an anode electrode.

The insulating layer may include a first insulating layer formed on a p-type semiconductor of the light-receiving device and a second insulating layer formed above the first insulating layer, and the waveguide-shaped structure may be formed on the second insulating layer and protrude out on a light incident surface of the light-receiving device in the traveling direction.

The waveguide-shaped structure may be modified into a dipole antenna structure that is open on an opposite side of a side connected to an external connection terminal of the light-receiving device.

In a structure in which a cathode electrode, an n-type semiconductor, and an intrinsic layer are sequentially stacked, the p-type semiconductor may be formed in an upper portion of the intrinsic layer, and the first insulating layer and an antireflection film may be formed in an upper layer of the p-type semiconductor.

Additional aspects of embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
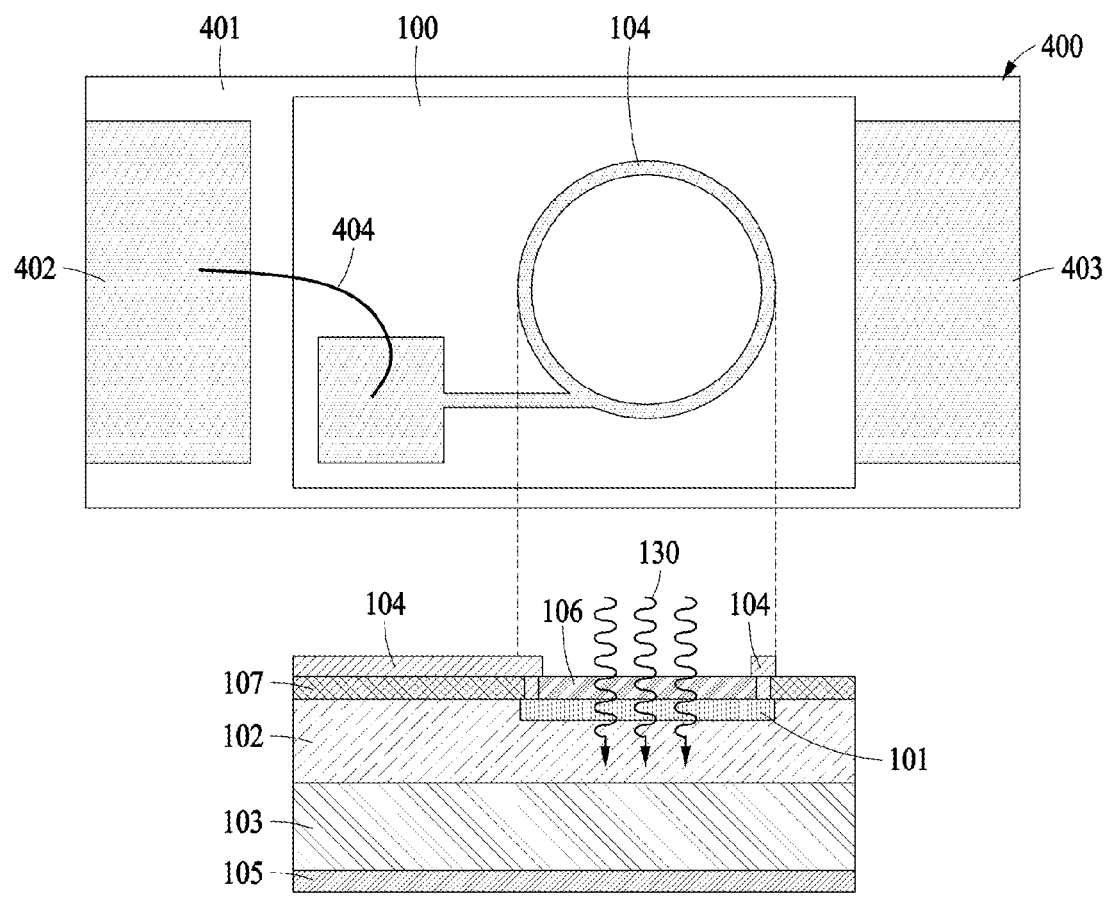
FIG. 1 illustrates a cross-sectional diagram and a package connection diagram of a pin light-receiving device including a circular-shaped electrode.

The following structural or functional descriptions of embodiments described herein are merely intended for the purpose of describing the embodiments described herein and may be implemented in various forms with modifications. Therefore, it should be understood that these embodiments are not construed as limited to the illustrated forms but to include all changes, equivalents, and replacements within the idea and the technical scope of the disclosure.

Although terms of "first," "second," and the like are used to explain various components, the components are not limited to such terms. These terms are used only to distinguish one component from another component. For example, a first component may be referred to as a second component, and similarly, the second component may be referred to as the first component within the scope of the present disclosure.

When it is mentioned that one component is "connected" or "accessed" to another component, it may be understood that the one component is directly connected or accessed to another component or that still other component is interposed between the two components.

As used herein, the singular forms "a," "an," and "the" are intended to include the plural forms as well, unless the context clearly indicates otherwise. As used herein, "A or B," "at least one of A and B," "at least one of A or B," "A, B or C," "at least one of A, B and C," and "at least one of A, B, or C," each of which may include any one of the items listed together in the corresponding one of the phrases, or all possible combinations thereof. It will be understood that the terms "comprise," "include," or "have," when used in this specification, specify the presence of stated features, integers, steps, operations, elements, components, or a combination thereof, but do not preclude the presence or addition of one or more other features, integers, steps, operations, elements, components, and/or combinations thereof.

Unless otherwise defined herein, all terms used herein including technical or scientific terms have the same meanings as those generally understood by one of ordinary skill in the art. Terms defined in dictionaries generally used should be construed to have meanings matching contextual meanings in the related art and are not to be construed as an ideal or excessively formal meaning unless otherwise defined herein.

Hereinafter, embodiments will be described in detail with reference to the accompanying drawings. When describing the embodiments with reference to the accompanying drawings, like reference numerals refer to like components and a repeated description related thereto will be omitted.

FIG. 1 illustrates a cross-sectional diagram and a package connection diagram of a pin light-receiving device including a circular-shaped electrode.

Referring to FIG. 1, a pin light-receiving device 100 may be a photodiode including an anode electrode 104 that is a circular-shaped electrode. Unlike a p-n junction diode, which is a simplest light-receiving device, the pin light-receiving device 100 may be a photodiode in which an intrinsic layer 102 is between a p-type semiconductor 101 and an n-type semiconductor 103, and an antireflection film 106 is formed in an upper layer of the p-type semiconductor 101. The pin light-receiving device 100 may absorb an electromagnetic wave 130 including light through a light-receiving area of the antireflection film 106. The pin light-receiving device 100 may be a device that forms a wide depletion layer when a reverse bias is applied and that has a structure where an absorption efficiency and responsiveness of a photon are improved. Although FIG. 1 illustrates a cross-sectional diagram of the pin light-receiving device 100, the embodiments are not necessarily limited thereto. Any light-receiving device that obtains electricity from a photon (e.g., a pn photodiode, a Schottky diode, a phototransistor, an avalanche photodiode (APD), and the like) may include the structure illustrated in FIG. 1.

The pin light-receiving device 100 may be connected to a package 400 for external connection. A cathode electrode 105 of the pin light-receiving device 100 may be connected while being attached to a metal electrode 403 of the package 400 using a conductive bonding material. The anode electrode 104 of the pin light-receiving device 100 may be connected to a metal electrode 402 of the package 400 through wire bonding 404. The anode electrode 104 may be connected to the p-type semiconductor 101 and may extend horizontally on an insulating layer 107 on a side of the metal electrode 402. The anode electrode 104 may form a circular-shaped closed passage.

The package 400 may have two terminals connected to the outside, a substrate 401 for implementing the pin light-receiving device 100, and two metal electrodes 402 and 403 for electrical signal transmission.

Figure 2:
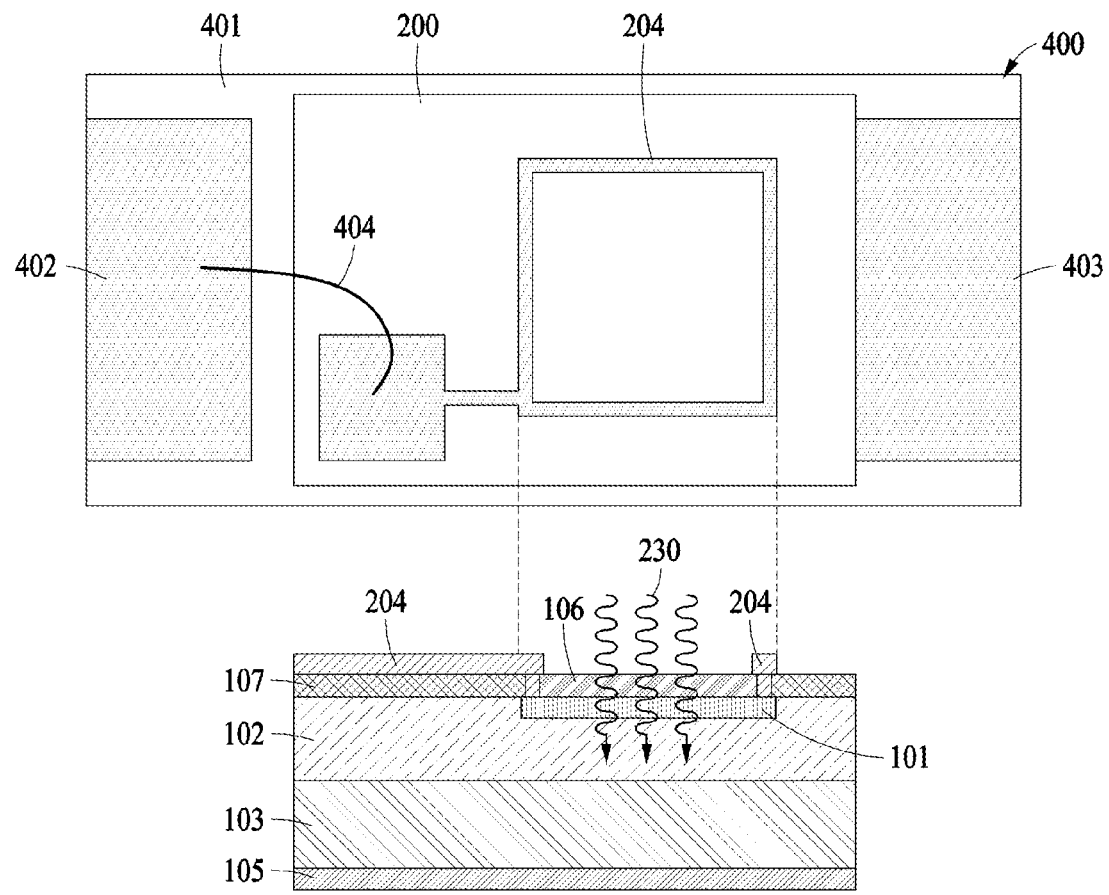
FIG. 2 illustrates a cross-sectional diagram and a package connection diagram of a pin light-receiving device including a rectangular-shaped electrode.

FIG. 2 illustrates a cross-sectional diagram and a package connection diagram of a pin light-receiving device including a rectangular-shaped electrode.

Referring to FIG. 2, a pin light-receiving device 200 may be a photodiode including an anode electrode 204 that is a rectangular-shaped electrode. The anode electrode 204 may be connected to the p-type semiconductor 101 and may extend horizontally on the insulating layer 107 on a side of the metal electrode 402. The anode electrode 204 may form a rectangular-shaped closed passage. Although FIG. 2 illustrates a cross-sectional diagram of the pin light-receiving device 200, the embodiments are not necessarily limited thereto. Any light-receiving device that obtains electricity from a photon (e.g., a pn photodiode, a Schottky diode, a phototransistor, an APD, and the like) may include the structure illustrated in FIG. 2.

Figure 3A:
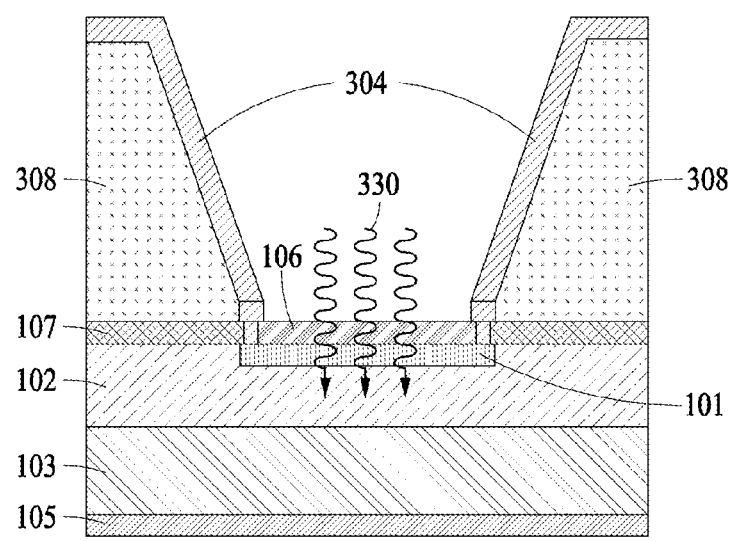
FIG. 3A is a cross-sectional diagram and a package connection diagram of a light-receiving device including a waveguide-shaped blocking structure according to an embodiment.

FIG. 3A is a cross-sectional diagram and a package connection diagram of a light-receiving device including a waveguide-shaped blocking structure according to an embodiment.

Referring to FIG. 3A, according to an embodiment, a light-receiving device 300 may include a waveguide-shaped structure (e.g., a blocking structure 304) that extends in a traveling direction of photons and high-frequency electromagnetic waves incident on a light-receiving area and that surrounds the light-receiving area. An insulating layer may include a first insulating layer 107 formed on the p-type semiconductor 101 of the light-receiving device 300 and a second insulating layer 308 formed on the first insulating layer 107. In a structure in which the cathode electrode 105, the n-type semiconductor 103, and the intrinsic layer 102 are sequentially stacked, the p-type semiconductor 101 may be formed in an upper portion of the intrinsic layer 102, and the first insulating layer 107 and the antireflection film 106 may be formed in an upper layer of the p-type semiconductor 101.

According to an embodiment, the blocking structure 304 may extend along a slope of the second insulating layer 308 on top of the second insulating layer 308 and may be the anode electrode of the light-receiving device 300. Although the blocking structure 304 of FIG. 3A is illustrated as a shape of a waveguide having a slope on a vertical cross section, the blocking structure 304 is not necessarily limited thereto and may extend in perpendicular to the light-receiving area in a traveling direction of photons and high-frequency electromagnetic waves incident on a light-receiving area through various semiconductor processing techniques. At least one insulator layer and metal wiring may be used to form a waveguide-shaped structure (e.g., the blocking structure 304) that extends in a traveling direction of photons and high-frequency electromagnetic waves incident on a light-receiving area.

Figure 4:
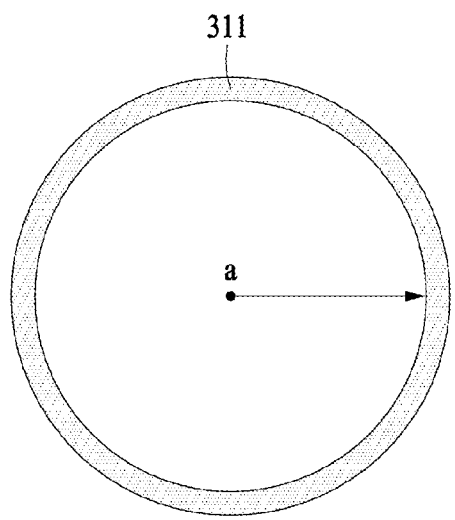
FIG. 4 illustrates a cross-sectional diagram of a blocking structure having a shape of a circular waveguide according to an embodiment and a cross-sectional diagram of a blocking structure having a shape of a rectangular waveguide according to an embodiment.
Figure 4:
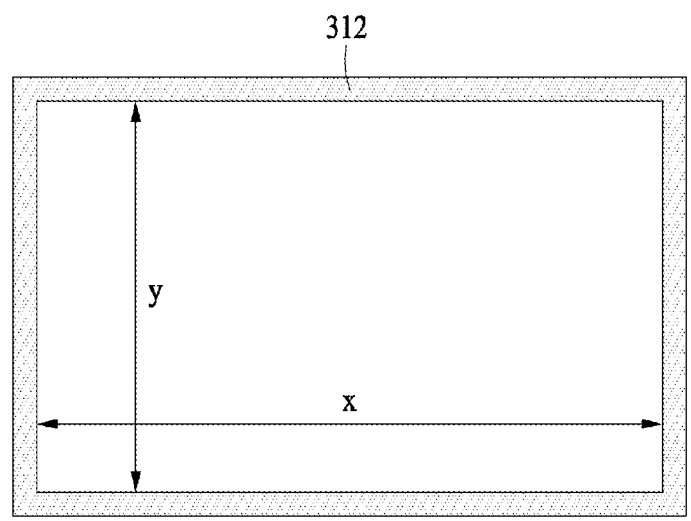

According to an embodiment, a waveguide may be a transmission line that is used for microwave and millimeter waves and that has a cutoff frequency. The blocking structure 304 may block electromagnetic waves of the cutoff frequency or less among electromagnetic waves incident on a light incident surface based on the cutoff frequency according to the type of the waveguide. The blocking structure 304 may have various forms on a horizontal cross section (e.g., the light incident surface) of the light-receiving device 300, as illustrated in FIG. 4 below. For example, the blocking structure 304 may be a circular-shaped electrode, which is a cross section of a circular waveguide, or a rectangular-shaped electrode, which is a cross section of a rectangular waveguide, on the light incident surface.

According to an embodiment, the light-receiving device 300 may eliminate interruption due to high-frequency electromagnetic waves having high power density based on the blocking structure 304 and thus prevent malfunction of the light-receiving device 300 and not cause deterioration in performance of the light-receiving device 300. The blocking structure 304 may be collectively manufactured through a semiconductor process and may utilize a package of an existing light-receiving device without a change. The blocking structure 304 may be applicable to any light-receiving device that obtains electricity from a photon (e.g., a pn photodiode, a Schottky diode, a phototransistor, an APD, and the like).

Figure 3B:
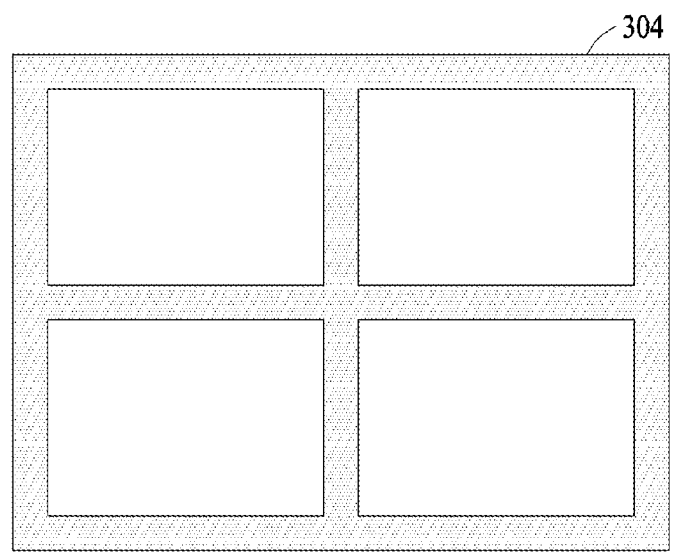
FIG. 3B is a diagram illustrating an example of a blocking structure shown in a lattice form according to an embodiment.

FIG. 3B is a diagram illustrating an example of a blocking structure shown in a lattice form according to an embodiment.

Referring to FIG. 3B, according to an embodiment, when the blocking structure 304 has a shape of a rectangular waveguide, the cutoff frequency of the blocking structure 304 may be adjusted by changing a cross section of a horizontal axis or a vertical axis. For example, the blocking structure 304 may have a high cutoff frequency by having a structure in which the cross section of the horizontal axis is divided. The blocking structure 304 may have the cross section of the horizontal axis in a lattice structure. The cutoff frequency of the blocking structure 304 may be increased through a structure in which the cross section of the horizontal axis is divided when a new service using millimeter waves is provided or when a signal close to the cutoff frequency according to a structure in which an area on the horizontal axis is not divided is used as an interference source.

According to an embodiment, the structure in which the cross section of the horizontal axis is divided may be applicable to an acquisition structure 620 illustrated in FIG. 6A below. The acquisition structure 620 may be formed as a structure in which the cross section of the horizontal axis is divided (e.g., a lattice structure) when a higher cutoff frequency is needed. A concrete lattice spacing may be calculated according to Equation 2 described with respect to FIG. 4 below.

FIG. 4 illustrates a cross-sectional diagram of a blocking structure having a shape of a circular waveguide and a cross-sectional diagram of a blocking structure having a shape of a rectangular waveguide according to an embodiment.

Referring to FIG. 4, the cutoff frequency of an anode electrode 311 in a shape of a circular waveguide and an anode electrode 312 in a shape of a rectangular waveguide may be respectively defined for a TE01 mode by Equation 1 and Equation 2 below.

$$f_c = \frac{1.8412}{2\pi a\sqrt{\mu e}} = \frac{1.8412c}{2\pi a} \quad \text{[Equation 1]}$$

$$f_c = \frac{1}{2x\sqrt{\mu e}} = \frac{c}{2x} \quad \text{[Equation 2]}$$

In Equation 1, a denotes a length of a radius of a circle that is a cross section of the shape of the circular waveguide. In Equation 2, x denotes the length of one side of a rectangle that is a cross section of the shape of the rectangular waveguide. In Equation 2, the length of one side of the rectangle (e.g., x) is inversely proportional to the cutoff frequency, and a lowest cutoff frequency may be obtained when x is the length of the long side of the rectangle. A waveguide-shaped anode electrode (e.g., the blocking structure 304 of FIGS. 3A and 3B) may block an electromagnetic wave having a wavelength equal to or higher than the cutoff frequency. For example, when the blocking structure 304 is an anode electrode in the shape of the circular waveguide and a is 1.5 mm to correspond to an area of a metal can-shaped package used in the industry, the electromagnetic wave having a frequency lower than the cutoff frequency of about 58.6 GHz may be blocked, thus a directional high-frequency signal having high power density may not affect an operation of the light-receiving device 300.

According to an embodiment, when photons and high-frequency electromagnetic waves with high power density are received on the light incident surface at the same time, the light-receiving device (e.g., the light-receiving device 300 of FIG. 3A) may generate an output current proportional to the photons by blocking the high-frequency electromagnetic waves using the waveguide-shaped blocking structure 304 and receiving only the photons through the light-receiving area of the light-receiving device 300.

According to an embodiment, the waveguide-shaped blocking structure 304 may be connected to the p-type semiconductor 101 of the light-receiving device 300, but may be connected to the cathode electrode 105 that is connected to the n-type semiconductor 103 through the substrate of the package for a via process or external connection.

Figure 5:
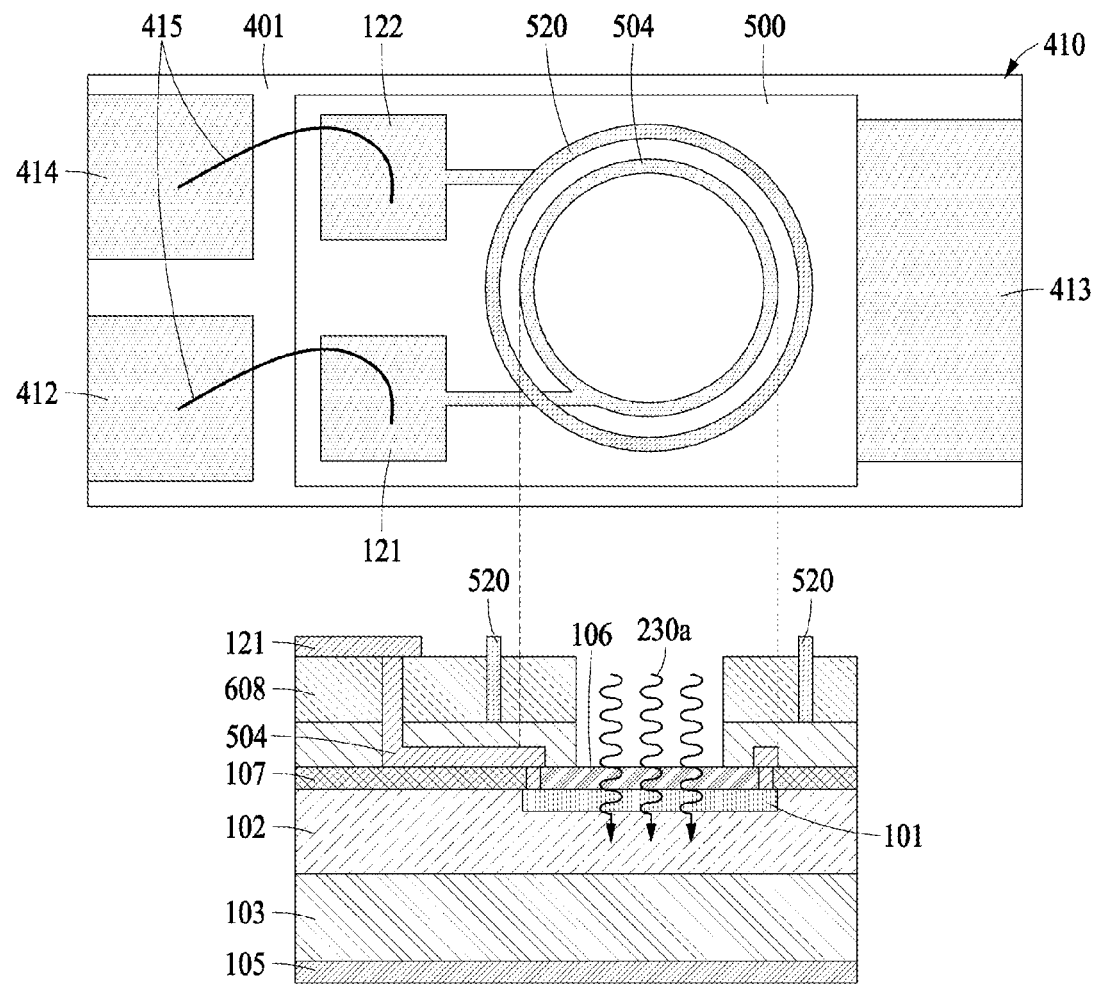
FIG. 5 illustrates a cross-sectional diagram and a package connection diagram of a light-receiving device including an electromagnetic wave acquisition structure having a shape of a circular waveguide according to an embodiment.

FIG. 5 illustrates a cross-sectional diagram and a package connection diagram of a light-receiving device including an electromagnetic wave acquisition structure having a shape of a circular waveguide according to an embodiment.

Referring to FIG. 5, according to an embodiment, a light-receiving device 500 may include a waveguide-shaped structure (e.g., an acquisition structure 520) that extends in a traveling direction of photons and high-frequency electromagnetic waves incident on a light-receiving area and that surrounds the light-receiving area. The insulating layer may include the first insulating layer 107 formed on the p-type semiconductor 101 of the light-receiving device 500 and a second insulating layer 608 formed on the first insulating layer 107. In the structure in which the cathode electrode 105, the n-type semiconductor 103, and the intrinsic layer 102 are sequentially stacked, the p-type semiconductor 101 may be formed in an upper portion of the intrinsic layer 102, and the first insulating layer 107 and the antireflection film 106 may be formed in an upper layer of the p-type semiconductor 101.

According to an embodiment, the acquisition structure 520 may be formed on the second insulating layer 608 and protrude out on the light incident surface of the light-receiving device 500 in the traveling direction of photons and high-frequency electromagnetic waves through semiconductor processing. For example, the acquisition structure 520 may be formed on at least one insulating layer through via processing or may be formed on the second insulating layer 608 through a process in which a pattern is formed on at least one insulating layer. The light-receiving device 500 may have the shape of a circular waveguide that extends in the same direction as a direction in which light 230*a* is incident and travels and may have a cutoff frequency characteristic according to Equation 1.

According to an embodiment, the light-receiving device 500 may separate paths of photons and high-frequency electromagnetic waves and may effectively eliminate high-frequency electromagnetic waves reaching the light-receiving area by including the acquisition structure 520 that acquires high-frequency electromagnetic waves based on the cutoff frequency characteristic. When exposed to photons and high-frequency electromagnetic waves, the light-receiving device 500 may separate the paths into a path through which photons reach the light-receiving area of the light-receiving device 500 and a path through which high-frequency electromagnetic waves ground to a connection terminal 122 through the acquisition structure 520.

According to an embodiment, the light-receiving device 500 may eliminate interruption due to high-frequency electromagnetic waves having high power density based on the acquisition structure 520 and thus prevent malfunction of the light-receiving device 500 and not cause deterioration in performance of the light-receiving device 500. The acquisition structure 520 may be collectively manufactured through a semiconductor process and may utilize a package of an existing light-receiving device without a change. The acquisition structure 520 may be applicable to any light-receiving device that obtains electricity from a photon (e.g., a pn photodiode, a Schottky diode, a phototransistor, an APD, and the like). The characteristic of the light-receiving device 500/of the acquisition structure 520 may be applicable to the acquisition structure 620 of FIG. 6A and an acquisition structure 621 of FIG. 6B.

Figure 6A:
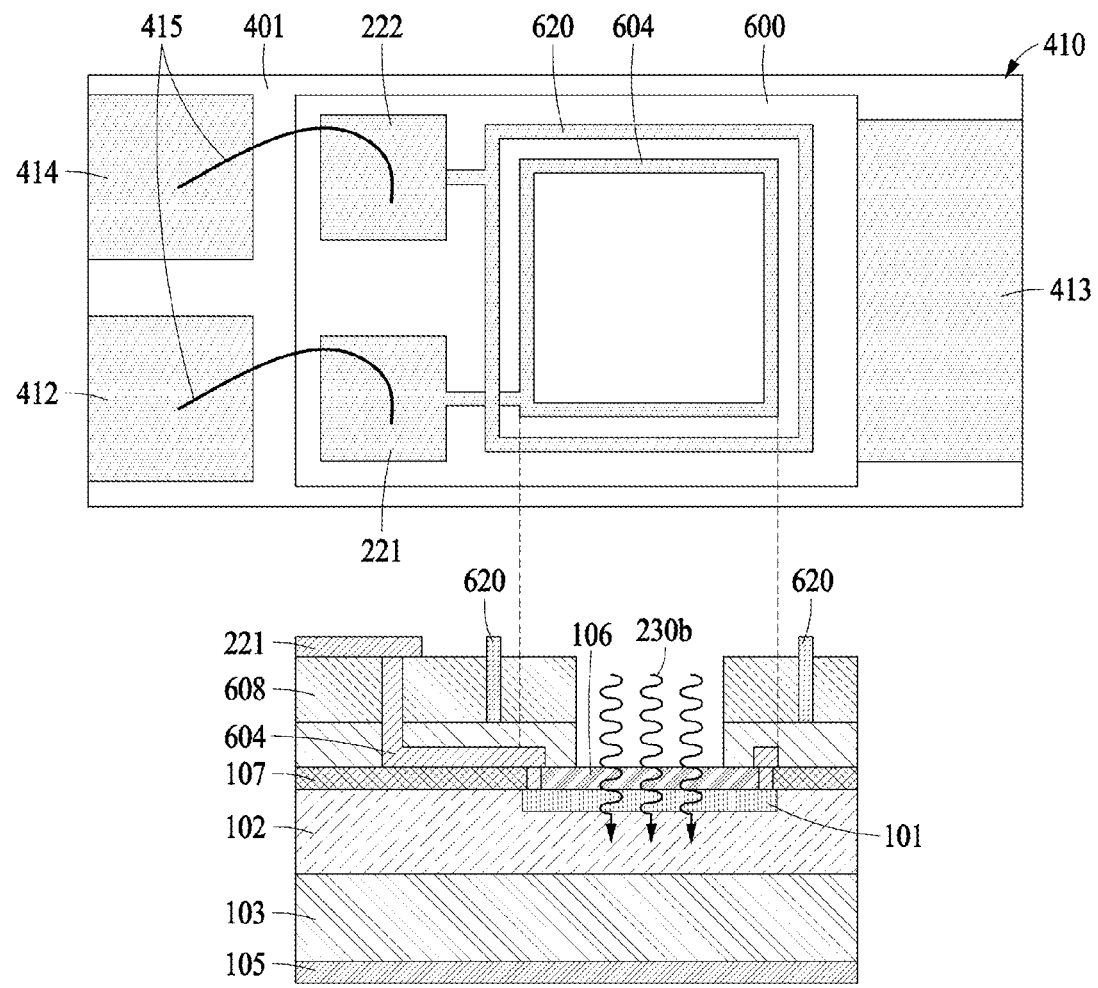
FIG. 6A is a cross-sectional diagram and a package connection diagram of a light-receiving device including an electromagnetic wave acquisition structure having a shape of a rectangular waveguide according to an embodiment.

FIG. 6A is a cross-sectional diagram and a package connection diagram of a light-receiving device including an electromagnetic wave acquisition structure having a shape of a rectangular waveguide according to an embodiment.

Referring to FIG. 6A, a light-receiving device 600 may include a waveguide-shaped structure (e.g., the acquisition structure 620) that extends in a traveling direction of photons and high-frequency electromagnetic waves incident on a light-receiving area of the antireflection film 106 and that surrounds the light-receiving area and insulating layers (first and second insulating layers 107 and 608) to fix the acquisition structure 620. The insulating layer may include the first insulating layer 107 formed on the p-type semiconductor 101 of the light-receiving device 600 and the second insulating layer 608 formed on the first insulating layer 107. In the structure in which the cathode electrode 105, the n-type semiconductor 103, and the intrinsic layer 102 are sequentially stacked, the p-type semiconductor 101 may be formed in an upper portion of the intrinsic layer 102, and the first insulating layer 107 and the antireflection film 106 may be formed in an upper layer of the p-type semiconductor 101.

According to an embodiment, the acquisition structure 620 may be formed on the second insulating layer 608 and protrude out on the light incident surface of the light-receiving device 600 in the traveling direction of photons and high-frequency electromagnetic waves through semiconductor processing. For example, the acquisition structure 620 may be formed on at least one insulating layer through via processing or may be formed on the second insulating layer 608 through a process in which a pattern is formed on at least one insulating layer. The light-receiving device 600 may have the shape of a circular waveguide that extends in the same direction as a direction in which light 230b is incident and travels and may have a cutoff frequency characteristic according to Equation 2.

According to an embodiment, the light-receiving device 600 may separate paths of photons and high-frequency electromagnetic waves and effectively eliminate high-frequency electromagnetic waves reaching the light-receiving area by including the acquisition structure 620 that acquires high-frequency electromagnetic waves based on the cutoff frequency characteristic. When exposed to photons and high-frequency electromagnetic waves, the light-receiving device 600 may separate the paths into a path through which photons reach the light-receiving area of the light-receiving device 600 and a path through which high-frequency electromagnetic waves ground to a connection terminal 222 through the acquisition structure 620.

Figure 6B:
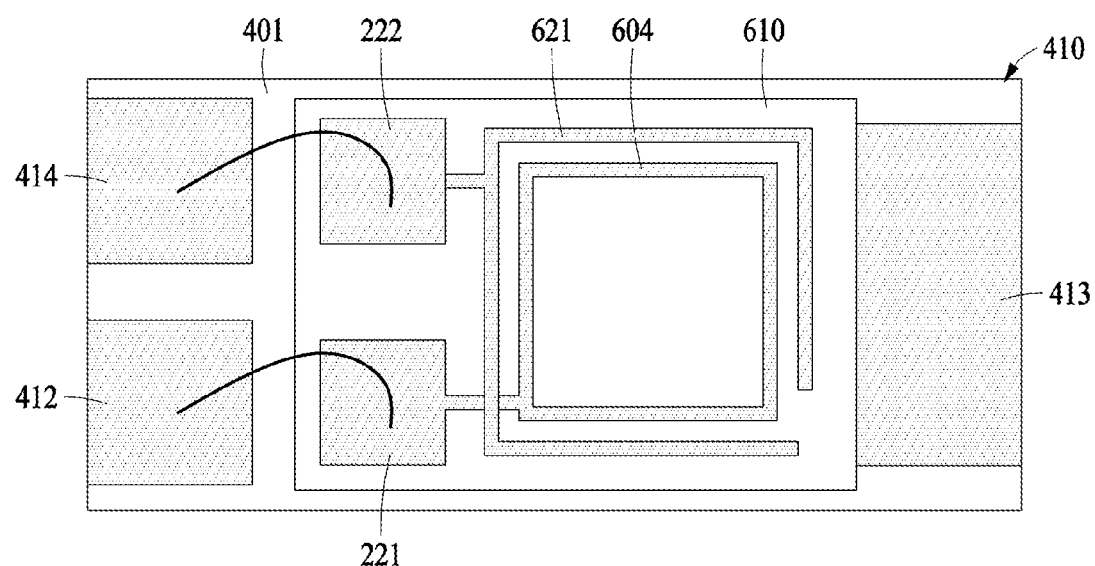
FIG. 6B is a cross-sectional diagram and a package connection diagram of a light-receiving device including a high-frequency acquisition structure having a shape of a rectangular waveguide according to an embodiment.

FIG. 6B is a package connection diagram of a light-receiving device including a high-frequency acquisition structure having a shape of a rectangular waveguide according to an embodiment.

Referring to FIG. 6B, according to an embodiment, a light-receiving device 610 may include a waveguide-shaped structure (e.g., the acquisition structure 621). The acquisition structure 621 may be modified into a dipole antenna structure that is open on an opposite side of a side connected to the external connection terminal 222 of the light-receiving device 610.

According to an embodiment, in order to eliminate electromagnetic interference caused by a service using a millimeter band, the acquisition structure 621 may remove high-frequency electromagnetic waves input to the light-receiving area or reduce power density by implementing a dipole antenna structure that resonates in a communication service band, thereby preventing malfunction of the light-receiving device 610. In the above case, a metal thickness of the acquisition structure 621 may be implemented as thin as the metal thickness of a general semiconductor process, unlike the waveguide-shaped structure.

Figure 7:
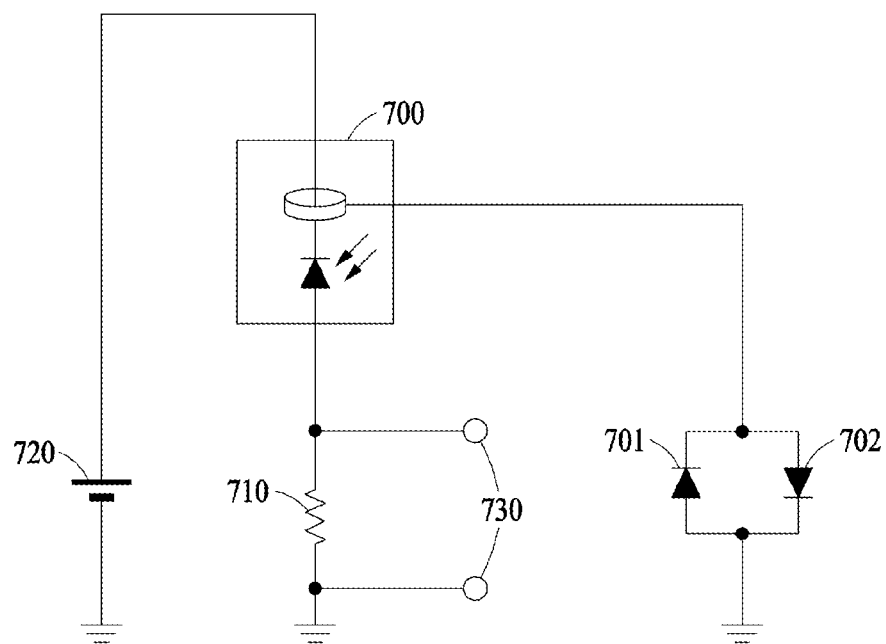
FIG. 7 is a diagram of a light receiver that uses a light-receiving device including a waveguide-shaped structure according to an embodiment.

FIG. 7 is a diagram illustrating a light receiver that uses a light-receiving device including a waveguide-shaped structure according to an embodiment.

Referring to FIG. 7, according to an embodiment, the light receiver may include a light-receiving device 700 and a plurality of diodes. The light-receiving device 700 may be one of the light-receiving devices 300, 500, 600, and 610 illustrated in FIG. 3A to 6B. The light receiver may block high-frequency electromagnetic waves based on a waveguide-shaped blocking structure (e.g., the blocking structure 304 of FIG. 3A) or connect induced high-frequency electromagnetic waves to the ground based on the waveguide-shaped acquisition structures (the acquisition structures 520, 620, and 621 of FIGS. 5, 6A, and 6B). The light receiver may determine a presence or absence of an interference signal by observing a diode current or voltage.

The components described in the embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the embodiments may be implemented by software, and the software may be recorded on a recording medium. The components, the functions, and the processes described in the embodiments may be implemented by a combination of hardware and software.

The above-described hardware devices may be configured to act as one or more software modules in order to perform the operations of the above-described embodiments, or vice versa.

While this disclosure includes embodiments illustrated with reference to limited diagrams, it will be apparent to one of ordinary skill in the art that various changes in form and details may be made in these embodiments without departing from the spirit and scope of the claims and their equivalents. Suitable results may be achieved if, for example, the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A light-receiving device comprising:
   a waveguide-shaped structure that extends in a traveling direction of photons and high-frequency electromagnetic waves incident on a light-receiving area and that surrounds the light-receiving area; and
   an insulating layer configured to fix the waveguide-shaped structure,
   wherein the waveguide-shaped structure is formed as an open-loop structure.

2. The light-receiving device of claim 1, wherein the waveguide-shaped structure has one of:
   a shape of a circular waveguide; and
   a shape of a rectangular waveguide.

3. The light-receiving device of claim 2, wherein the shape of the rectangular waveguide is formed in a lattice structure.

4. The light-receiving device of claim 1, wherein:
   the insulating layer comprises:
   a first insulating layer formed on a p-type semiconductor of the light-receiving device; and
   a second insulating layer formed on the first insulating layer, and the waveguide-shaped structure extends along a slope of the second insulating layer on top of the second insulating layer and is an anode electrode.

5. The light-receiving device of claim 1, wherein:
the insulating layer comprises:
a first insulating layer formed on a p-type semiconductor of the light-receiving device; and
a second insulating layer formed above the first insulating layer, and
the waveguide-shaped structure is formed on the second insulating layer and protrudes out on a light incident surface of the light-receiving device in the traveling direction.

6. The light-receiving device of claim 5, wherein the waveguide-shaped structure is modified into a dipole antenna structure that is open on an opposite side of a side connected to an external connection terminal of the light-receiving device.

7. The light-receiving device of claim 5, wherein:
in a structure in which a cathode electrode, an n-type semiconductor, and an intrinsic layer are sequentially stacked, the p-type semiconductor is formed in an upper portion of the intrinsic layer, and
the first insulating layer and an antireflection film are formed in an upper layer of the p-type semiconductor.

8. A light receiver comprising:
a light-receiving device; and
a plurality of diodes,
wherein the light-receiving device comprises:
a waveguide-shaped structure that extends in a traveling direction of photons and high-frequency electromagnetic waves incident on a light-receiving area and that surrounds the light-receiving area; and
an insulating layer configured to fix the waveguide-shaped structure, wherein the waveguide-shaped structure is formed as an open-loop structure.

9. The light receiver of claim 8, wherein the waveguide-shaped structure has one of:
a shape of a circular waveguide; and
a shape of a rectangular waveguide.

10. The light receiver of claim 9, wherein the shape of the rectangular waveguide is formed in a lattice structure.

11. The light receiver of claim 8, wherein:
the insulating layer comprises:
a first insulating layer formed on a p-type semiconductor of the light-receiving device; and
a second insulating layer formed on the first insulating layer, and
the waveguide-shaped structure extends along a slope of the second insulating layer on top of the second insulating layer and is an anode electrode.

12. The light receiver of claim 8, wherein the insulating layer comprises:
a first insulating layer formed on a p-type semiconductor of the light-receiving device; and
a second insulating layer formed on the first insulating layer, and
the waveguide-shaped structure is formed on the second insulating layer and protrudes out on a light incident surface of the light-receiving device in the traveling direction.

13. The light receiver of claim 12, wherein the waveguide-shaped structure is modified into a dipole antenna structure that is open on an opposite side of a side connected to an external connection terminal of the light-receiving device.

14. The light receiver of claim 12, wherein:
in a structure in which a cathode electrode, an n-type semiconductor, and an intrinsic layer are sequentially stacked, the p-type semiconductor is formed in an upper portion of the intrinsic layer, and
the first insulating layer and an antireflection film are formed in an upper layer of the p-type semiconductor.

* * * * *